US012039638B2

United States Patent
Nickel et al.

(10) Patent No.: US 12,039,638 B2
(45) Date of Patent: Jul. 16, 2024

(54) MAGNETIC RESONANCE IMAGING RECONSTRUCTION USING MACHINE LEARNING

(71) Applicant: Siemens Healthineers AG, Forchheim (DE)

(72) Inventors: Marcel Dominik Nickel, Herzogenaurach (DE); Thomas Benkert, Neunkirchen am Brand (DE); Simon Arberet, Princeton, NJ (US); Boris Mailhe, Plainsboro, NJ (US); Mariappan S. Nadar, Plainsboro, NJ (US)

(73) Assignee: Siemens Healthineers AG, Forchheim (DE)

( * ) Notice: Subject to any disclaimer, the term of this patent is extended or adjusted under 35 U.S.C. 154(b) by 478 days.

(21) Appl. No.: 17/443,149

(22) Filed: Jul. 21, 2021

(65) Prior Publication Data

US 2022/0051454 A1 Feb. 17, 2022

(30) Foreign Application Priority Data

Aug. 11, 2020 (DE) .......................... 102020210136.1

(51) Int. Cl.
*G06T 11/00* (2006.01)
*G06N 3/04* (2023.01)
*G06N 3/08* (2023.01)

(52) U.S. Cl.
CPC .............. *G06T 11/006* (2013.01); *G06N 3/04* (2013.01); *G06N 3/08* (2013.01); *G06T 2210/41* (2013.01); *G06T 2211/424* (2013.01)

(58) Field of Classification Search
None
See application file for complete search history.

(56) References Cited

U.S. PATENT DOCUMENTS

| 10,712,416 B1* | 7/2020 | Sandino | G06N 3/045 |
| 11,185,249 B2* | 11/2021 | Schlemper | G01R 33/5611 |
| 2017/0116497 A1* | 4/2017 | Georgescu | G06N 3/006 |

OTHER PUBLICATIONS

Lustig, Michael, David Donoho, and John M. Pauly. "Sparse MRI: The application of compressed sensing for rapid MR imaging." Magnetic Resonance in Medicine: An Official Journal of the International Society for Magnetic Resonance in Medicine 58.6 (2007): 1182-1195.
Lustig, Michael, et al. "Compressed sensing MRI." IEEE signal processing magazine 25.2 (2008): 72-82.
Hammernik, Kerstin, et al. "Learning a variational network for reconstruction of accelerated MRI data." Magnetic resonance in medicine 79.6 (2018): 3055-3071.

(Continued)

*Primary Examiner* — Vikkram Bali

(57) ABSTRACT

Magnetic resonance imaging (MRI) image reconstruction using machine learning is described. A variational or unrolled deep neural network can be used in the context of an iterative optimization. In particular, a regularization operation can be based on a deep neural network. The deep neural network can take, as an input, an aliasing data structure being indicative of aliasing artifacts in one or prior images of the iterative optimization. The deep neural networks can be trained to suppress aliasing artifacts.

13 Claims, 4 Drawing Sheets

(56) References Cited

OTHER PUBLICATIONS

Knoll, Florian, et al. "Deep learning methods for parallel magnetic resonance image reconstruction." arXiv preprint arXiv:1904.01112 (2019).
Ronneberger, Olaf, Philipp Fischer, and Thomas Brox. "U-net: Convolutional networks for biomedical image segmentation." International Conference on Medical image computing and computer-assisted intervention. Springer, Cham, 2015.
Pruessmann, Klaas P., et al. "SENSE: sensitivity encoding for fast MRI." Magnetic Resonance in Medicine: An Official Journal of the International Society for Magnetic Resonance in Medicine 42.5 (1999): 952-962.
Narkiss, Guy, et al. "Sequential Subspace Optimization Method for Large-Scale Unconstrained Problems," Jan. 2005.
She, Huajun, et al. Sparse BLIP: Blind Iterative Parallel imaging reconstruction lusing compressed sensing. Mag nelic resonance in medicine, 2014, 71. Jg., Nr. 2, IS. 645-660.
Lachner, Sebastian. Ultra-high-field (7 Tesla) sodium magnetic resonance imaging (23Na-MRI) using high-frequency multi-channel receiver coils and compressed sensing-based iterative image reconstruction. 2020.
Sarty, Gordon E. The relationship between the Nyquist criterion and the point, spread function. Concepts in Magnetic Resonance Part B: Magnetic Resonance I Engineering: An Educational Journal, 2003, 17. Jg., Nr. 1, S. 17-24.

\* cited by examiner

MAGNETIC RESONANCE IMAGING RECONSTRUCTION USING MACHINE LEARNING

RELATED APPLICATION

This application claims the benefit of DE 10 2020 210 136.1 filed Aug. 11, 2020, which is hereby incorporated by reference in its entirety.

TECHNICAL FIELD

Various examples of the disclosure generally relate to magnetic resonance imaging (MRI). Various examples specifically relate to machine-learned (ML) algorithms used for MRI image reconstruction.

BACKGROUND

Acquisition of MRI data can require significant time. To accelerate the data acquisition, it is known to undersample k-space. Missing data can be reconstructed (MRI image reconstruction).

Various techniques for implementing MRI image reconstruction are known. One prior art technique is referred to as compressed sensing. See, e.g., Lustig, Michael, David Donoho, and John M. Pauly. "Sparse MRI: The application of compressed sensing for rapid MR imaging." *Magnetic Resonance in Medicine: An Official Journal of the International Society for Magnetic Resonance in Medicine* 58.6 (2007): 1182-1195; also see Lustig, Michael, et al. "Compressed sensing MRI." IEEE signal processing magazine 25.2 (2008): 72-82.

Often, such prior art techniques rely on representation of MRI images in a wavelet basis. As described in id., page 13, section "Image Reconstruction", an optimization problem—typically defined in an $l^1$-norm—can be defined. Data consistency can be enforced by a data-consistency operation ensuring that the reconstructed image is described well by the underlying k-space data sparsely sampled. The data-consistency operation is also sometimes referred to as data-fidelity operation or forward-sampling operator. In addition to the data-consistency operation, oftentimes, a regularization operation is considered. The regularization operation is conventionally based on a non-linear $l^1$-norm. A classic formulation of the regularization operation is based on sparsity of the MRI image in a transform domain such as a wavelet domain in combination with pseudo-random sampling that can introduce aliasing artifacts that are incoherent in the respective transform domain. Another example would be a Fourier domain, in particular for acquisitions of a dynamically moving target. Another example would be total variation (TV) used in connection with non-Cartesian k-space trajectories such as radial and spiral trajectories.

Based on the data-consistency operation and the regularization operation, an iterative optimization can be implemented. The iterative optimization can include multiple iterations, each iteration including the calculation of the data-consistency operation and the regularization operation in an alternating fashion.

Recently, the regularization operation has been implemented by deep neural networks. Here, different iterations of the optimization are implemented by different layers of the deep neural network. See Hammernik, Kerstin, et al. "Learning a variational network for reconstruction of accelerated MRI data." Magnetic resonance in medicine 79.6 (2018): 3055-3071, as well as Knoll, Florian, et al. "Deep learning methods for parallel magnetic resonance image reconstruction." arXiv preprint arXiv:1904.01112 (2019). Such techniques are based on the finding that wavelet compositions can be expressed as a subset of trainable convolutions of a deep neural network such as a convolutional neural network and that soft-thresholding can be used as an activation function in the deep neural network.

It has been found that MRI image reconstruction using deep neural networks can be limited in terms of accuracy in view of aliasing artifacts due to the sparse sampling of k-space.

SUMMARY

Accordingly, a need exists for advanced techniques of MRI image reconstruction using deep neural networks.

This need is met by the features of the independent claims. The features of the dependent claims define embodiments.

A computer-implemented method for reconstructing an MRI image is provided. The method includes obtaining an MRI measurement dataset. The MRI measurement dataset is acquired using an undersampling trajectory of k-space, as well as a receiver coil array. The method also includes performing an iterative optimization to obtain a reconstructed MRI image. This is based on the MRI measurement dataset. The iterative optimization includes, for each iteration of multiple iterations of the iterative optimization, a regularization operation and a data-consistency operation. Based on the regularization operation and the data-consistency operation, a respective current image is obtained. The data-consistency operation is based on a difference between the MRI measurement data set and a synthesized MRI measurement dataset. The synthesized MRI measurement dataset is based on a k-space representation of a prior image of the multiple iterations, the undersampling trajectory, and a sensitivity map associated with the receiver coil array. An input of the regularization operation includes the prior image and an aliasing data structure of the respective iteration. The aliasing data structure is indicative of aliasing artifacts in one or prior images of one or more preceding iterations.

A computer program, a computer-program product, or a computer-readable storage medium includes program code. The program code can be executed by at least one processor. Upon loading and executing the program code, the at least one processor performs a computer-implemented method for reconstructing an MRI image. The method includes obtaining an MRI measurement dataset. The MRI measurement dataset is acquired using an undersampling trajectory of k-space, as well as a receiver coil array. The method also includes performing an iterative optimization to obtain a reconstructed MRI image. This is based on the MRI measurement dataset. The iterative optimization includes, for each iteration of multiple iterations of the iterative optimization, a regularization operation and a data-consistency operation. Based on the regularization operation and the data-consistency operation, a respective current image is obtained. The data-consistency operation is based on a difference between the MRI measurement data set and a synthesized MRI measurement dataset. The synthesized MRI measurement dataset is based on a k-space representation of a prior image of the multiple iterations, the undersampling trajectory, and a sensitivity map associated with the receiver coil array. An input of the regularization operation includes the prior image and an aliasing data structure of the respective iteration. The aliasing data structure is indicative of aliasing artifacts in one or prior images of one or more preceding iterations.

A device includes a control circuitry for reconstructing an MRI image. The control circuitry is configured to obtain an MRI measurement dataset. The MRI measurement dataset is acquired using an undersampling trajectory of k-space, as well as a receiver coil array. The control circuitry is also configured to perform an iterative optimization to obtain a reconstructed MRI image. This is based on the MRI measurement dataset. The iterative optimization includes, for each iteration of multiple iterations of the iterative optimization, a regularization operation and a data-consistency operation. Based on the regularization operation and the data-consistency operation, a respective current image is obtained. The data-consistency operation is based on a difference between the MRI measurement data set and a synthesized MRI measurement dataset. The synthesized MRI measurement dataset is based on a k-space representation of a prior image of the multiple iterations, the undersampling trajectory, and a sensitivity map associated with the receiver coil array. An input of the regularization operation includes the prior image and an aliasing data structure of the respective iteration. The aliasing data structure is indicative of aliasing artifacts in one or prior images of one or more preceding iterations.

A computer-implemented method for training a convolutional neural network is provided. The convolutional neural network includes multiple layers. The multiple layers are associated with regularization operations of multiple iterations of an iterative optimization for reconstruction of an MRI image during an inference phase. The method includes, during a training phase preceding the inference phase, performing a further iterative optimization. The further iterative optimization is based on a loss function. The further iterative optimization is to determine weights of the convolutional neural network. The loss function is based on a difference between an output of the convolutional neural network and an MRI image that is predefined as ground truth. The loss function includes an aliasing term that penalizes aliasing artifacts in the output of the convolutional neural network.

A computer program, a computer-program product, or a computer-readable storage medium includes program code. The program code can be executed by at least one processor. Upon loading and executing the program code, the at least one processor performs a computer-implemented for training a convolutional neural network. The convolutional neural network includes multiple layers. The multiple layers are associated with regularization operations of multiple iterations of an iterative optimization for reconstruction of an MRI image during an inference phase. The method includes, during a training phase preceding the inference phase, performing a further iterative optimization. The further iterative optimization is based on a loss function. The further iterative optimization is to determine weights of the convolutional neural network. The loss function is based on a difference between an output of the convolutional neural network and an MRI image that is predefined as ground truth. The loss function includes an aliasing term that penalizes aliasing artifacts in the output of the convolutional neural network.

A device includes a control circuitry for training a convolutional neural network is provided. The convolutional neural network includes multiple layers. The multiple layers are associated with regularization operations of multiple iterations of an iterative optimization for reconstruction of an MRI image during an inference phase. The control circuitry is configured, during a training phase preceding the inference phase, to perform a further iterative optimization. The further iterative optimization is based on a loss function. The further iterative optimization is to determine weights of the convolutional neural network. The loss function is based on a difference between an output of the convolutional neural network and an MRI image that is predefined as ground truth. The loss function includes an aliasing term that penalizes aliasing artifacts in the output of the convolutional neural network.

It is to be understood that the features mentioned above and those yet to be explained below may be used not only in the respective combinations indicated, but also in other combinations or in isolation without departing from the scope of the invention.

DETAILED DESCRIPTION OF EMBODIMENTS

Figure 1:
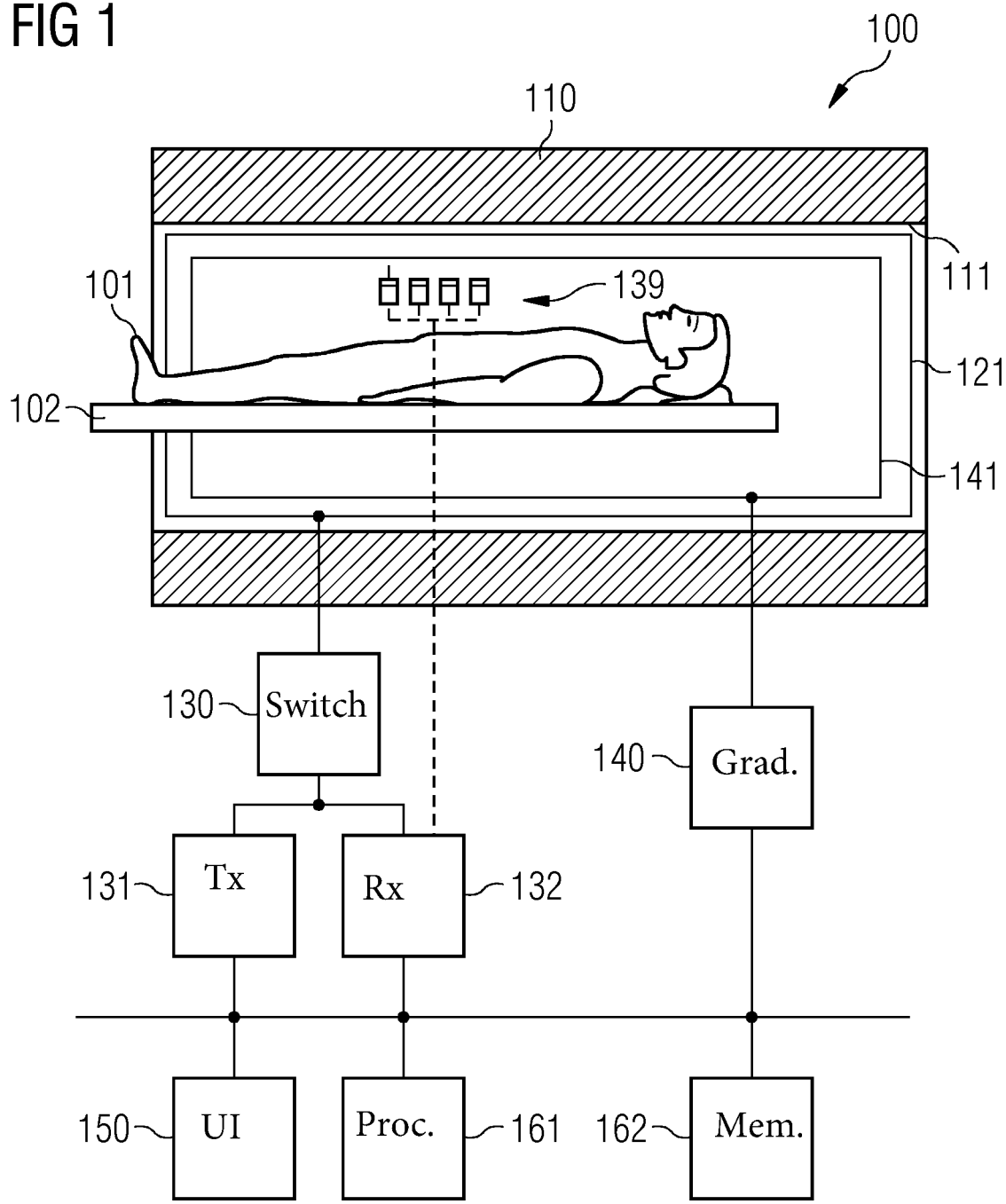
FIG. 1 schematically illustrates an MRI device according to various examples.

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

In the following, embodiments of the invention will be described in detail with reference to the accompanying drawings. It is to be understood that the following description of embodiments is not to be taken in a limiting sense. The scope of the invention is not intended to be limited by the embodiments described hereinafter or by the drawings, which are taken to be illustrative only.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various techniques described herein generally relate to MRI imaging. MRI data (or raw data) is acquired in k-space by sampling k-space. Parallel imaging can be applied. Here, MRI data is acquired using an array of receiver coils having a predefined spatial sensitivity. The set of MRI data (MRI measurement dataset) is sparsely sampled in k-space, i.e., MRI data is acquired below the Nyquist threshold for a given field of view. This is sometimes referred to as undersampling k-space. According to various examples, the MRI measurement datasets may be obtained using an undersampling trajectory. When acquiring MRI measurement datasets using an undersampling trajectory, for certain k-space locations, raw MRI data is not sampled and the missing information is reconstructed later on. A so-called acceleration factor R is indicative of the fraction of those k-space locations along the undersampling trajectory for which no raw data samples are acquired. Larger (smaller) acceleration factors may result in a shorter (longer) scan times.

Then, MRI image reconstruction is employed in order to reconstruct an MRI image (reconstructed MRI image) without or having reduced aliasing artifacts. The MRI image reconstruction often relies on predetermined or calibrated coil sensitivity maps (CSMs) of multiple receiver coils of the RF receiver of the MRI device are used.

Various techniques rely on MRI image reconstruction using ML algorithms. Oftentimes, a trained algorithm can outperform conventional reconstructions (including iterative approaches such as Compressed Sensing) when applied to a known/trained acquisition. This also goes by the name of deep learning (DL) reconstruction and typically relies on neural networks. According to examples, the reconstruction of an MRI dataset is facilitated using a machine-learning (ML) algorithm and/or using trained functions. As a general rule, the ML algorithm employed in the various examples may include a trained neural network, e.g., a deep-learning network. A deep neural network that can be used for implementing the regularization operation is the U-net, see Ronneberger, Olaf, Philipp Fischer, and Thomas Brox. "U-net: Convolutional networks for biomedical image segmentation." International Conference on Medical image computing and computer-assisted intervention. Springer, Cham, 2015. The U-net employs skip-connections between hidden layers and down-sampling and up-sampling of feature maps.

For example, an iterative optimization can include (i) a regularization operator—that is implemented by a trained neural network such as a Convolutional Neural Network (CNN)—for filtering of the input MRI dataset using convolutions and non-linear activations; and (ii) a data-consistency operator (sometimes referred to as forward-sampling operator or data fidelity operator) for computation of an MRI forward model to assure agreement of the reconstructed MRI dataset with the MRI measurement data.

This approach of using an iterative optimization together with a deep-neural network having layers associated with each iteration goes by the name of a variational neural network (VNN). The complete network is also called an unrolled image reconstruction network.

Multiple iterations of (i) and (ii) iteratively refine the reconstructed MRI measurement dataset, wherein an appropriate optimization technique, for example a gradient descent optimization technique or Landweber iterations, or prima-dual method, or alternating direction method of multipliers as known in the art, may be used to optimize parameters from iteration to iteration, i.e., to minimize a goal function including the regularization operator and the data-consistency operator. Such optimization technique may define parts of the data-consistency operation. The data-consistency operation can be based on the squared $l_2$-norm of the difference between measured data and synthesized data using a signal model. A gradient can be considered, in accordance with the optimization technique. In particular for decorrelated data with Gaussian noise, this can be a good choice. The signal model can be SENSE-type and, in particular, may rely on predefined CSMs. The CSMs can be calculated separately.

By using the ML algorithm in the context of the iterative optimization and, more specifically, the regularization operator, an increased image quality of the respective reconstructed MRI dataset may be provided. A reduced noise amplification and reduced image artifacts can be obtained, in comparison with the conventional reconstruction techniques. The natural image appearance may be better preserved using ML algorithm, e.g., without causing significant blurring in comparison to techniques with hand-crafted regularization operators. Conventional compressed sensing techniques may be slow and may result in less natural looking images. Using the ML algorithm, faster image reconstruction may be achieved using a predefined number of iterations of the ML algorithm. The reconstruction time is usually several orders of magnitude faster than in other iterative methods. A further advantage of such deep-learning MRI image reconstruction is that patient-specific tuning of the regularization operation of the iterative optimization is not required.

One or more parameters of the ML algorithm may be determined using training based on a ground-truth MRI dataset, which may include reference MRI images with reduced MRI artifacts and/or noise amplification. The ground-truth MRI dataset can be used to generate synthetic undersampled MRI data and then MRI image reconstruction can be used to reconstruct a synthetically undersampled image. An offline end-to-end training is possible to obtain better results.

Next, details with respect to the variational network/the unrolled network implementing the iterative optimization are described.

For an unrolled network, one considers N iterations. $\mathcal{U} = 1 \ldots N$ is the index counting iterations of the optimization. The number of iterations is a hyperparameter and the networks vary from iteration to iteration, possibly also in the architecture. At the beginning ($\mathcal{U}=0$), an initial guess for the image tensor $I^{(0)}$ is assumed which has e.g. vanishing entries or which is an initial non-trained reconstruction. From there in each iteration An image tensor $J^{(n)}$ is determined at which the next gradient will be evaluated. For known approaches this is a linear combination of the previous image tensors $I^{(n)}$, i.e.

$J^{(n)}=\Sigma_{i=0}^{n-1}\lambda_i I^{(i)}$. The coefficients may be fixed or trained. For $\lambda_i = c\delta_{i,n-1}$ this is an ISTA-like iteration. Also, Nesterov accelerations are used.

More abstract, the previous images may be concatenated to a tensor $\mathcal{J}^{(n)}=(I^{(0)}, \ldots, I^{(n-1)})$ with an additional dimension running over n. Then, one can determine $$\mathcal{J}^{(n)}=K^{(n)}\otimes \mathcal{J}^{(n)}, \quad (1)$$

where the convolution kernel $K^{(n)}$ treats n as a channel (i.e. has dense connections for this dimensions) and may further convolute spatial and/or other existing dimensions. All known updates are a subset of this generalization.

Also, a restriction to a limited number of previous images is possible. Further, the convolution kernel $K^{(n)}$ may be considered as known (relying on conventional optimization with momentum), trained, but initialized with an initial guess based on conventional techniques or trained as the other parameters (with some random initialization scheme).

The gradient $g^{(n)}$ is calculated at $J^{(n)}$. Again, it is possible to stack all calculated gradients $\mathcal{G}(n)=(g^{(1)}, \ldots, g^{(n)})$ or consider at least more than one gradient.

A new image candidate is calculated. In the most abstract form through $$\tilde{I}^{(n)}=Q^{(n)}\otimes(\mathcal{J}^{(n)},\mathcal{G}^{(n)}) \quad (2)$$

with convolution kernel $Q^{(n)}$. The latter may be externally provided and the formulation also covers conventional gradient descent optimization with and without momentum.

Finally, $\tilde{I}^{(n)}$ is passed through a deep neural network $\mathcal{U}^{(n)}$ which serves as the regularization operation $$I^{(n)}=\mathcal{U}^{(n)}(\tilde{I}^{(n)}). \quad (3)$$

This is the main trained component of the reconstruction. $I^{(N)}$ is the reconstructed MRI image.

Hereinafter, techniques are described that facilitate providing the reconstructed MRI image having reduced aliasing artifacts.

As a general rule, various undersampling trajectories may be used. For instance, Cartesian undersampling trajectories can be used. It would also be possible to use non-Cartesian undersampling trajectories, e.g., spiral trajectories or random trajectories. Cartesian undersampling trajectories are also referred to as regular undersampling trajectories.

The amount of undersampling, e.g., missing data points to full sampling of k-space, is often referred to as acceleration factor. Firstly, for sake of simplicity, regular undersampling of k-space with acceleration factor R is assumed. A SENSE-type reconstruction can be used, see Pruessmann, Klaas P., et al. "SENSE: sensitivity encoding for fast MRI." *Magnetic Resonance in Medicine: An Official Journal of the International Society for Magnetic Resonance in Medicine* 42.5 (1999): 952-962.

R pixels are aliased in the phase encoding plane (considering 2d or 3d Cartesian undersampling trajectories) and for the linear parallel imaging problem only those are correlated. Assuming $N_c$ receiver channels, the SENSE reconstruction decouples and simplifies to the following problem, to be solved by an iterative optimization:

$$I = \arg\min_I \|CI-D\|^2, \quad (4)$$

where C is an $N_c \times R$ dimensional complex-valued matrix, I a vector with R elements and D the aliased MRI data of an MRI data of an MRI dataset in image space with $N_c$ components. Equation (4) defines the data-consistency operation. It ensures that the k-space representation of the reconstructed image equals the measured data. The data-consistency operation is thus based on the difference between the MRI measurement dataset and a synthesized MRI measurement dataset that is based on the k-space representation of a prior image of the multiple iterations, the undersampling trajectory, and the CSMs, all included in the matrix C (thus, constituting the signal model). The reconstructed image is given as $$I=(C^\dagger C)^{-1}C^\dagger D. \quad (5)$$

Being a linear problem, it is helpful to introduce the unmixing weights $$\Xi=(C^\dagger C)^{-1}C^\dagger, \quad (6)$$

which have dimensionality $R\times N_c$ and give reconstructed images as $I=\Xi D$. These can be interpreted as a coil combination that also weights the respective coils such that signals are unfolded. They suppress unexpected aliased signal in case it only occurs due to aliasing in a given channel.

Then, it is possible to determine the linear response $I \to I+\delta I$ for a small systematic error $C \to C+\delta C$.

Linear expansion at a minimum gives $$\delta I = -(C^\dagger C)^{-1}C^\dagger \delta CI \quad (7)$$
$$= -\Xi \delta CI,$$

$\delta CI$ is the non-aliased image with the error $\delta C$ in the CSMs. This aliased error is unfolded with unmixing weights $\Xi$.

Secondly, an extension of the above to an arbitrary sampling yields that $\Xi$ becomes the pseudo-inverse of the linear problem running over all pixels instead of just R decoupled indices. The aliased image is then the coil error times the image I convolved with the point-spread function of the undersampling trajectory. The aliasing therefore relates to the Fourier transform of the undersampling trajectory.

Since iterative approaches including Compressed Sensing and also variational neural networks rely more on the gradient/the data-consistency operation, also a closer look on the latter is helpful. Considering the data-consistency operation:

$$X^{(I)}=\|PUCI-D\|^2, \quad (8)$$

where C are the CSMs, U is the Fourier transformation, P the projection on the acquired sampling pattern and D the acquired data. The gradient is given by $$\nabla_{I\chi}=C^\dagger U^\dagger(PUCI-D), \quad (9)$$

where $P=P^2=P^\dagger$ is exploited. Also note that $U^\dagger PU$ is the convolution with the point-spread function of the undersampling trajectory.

Various techniques are based on the finding that an error in the CSMs or more generally the signal model leads to aliasing artifacts. Again, assuming an error $C \to C+\delta C$ in the CSMs gives an error in the gradient of $$\delta \nabla_{I\chi}=\delta C^\dagger C^\dagger(PUCI-D)+C^\dagger U^\dagger PU\delta CI+\mathcal{O}(\delta C^2). \quad (10)$$

At the true minimum where $PUCI \approx D$ there is a non-vanishing gradient $C^\dagger U^\dagger PU\delta CI$, which is again related to a convolution of the deviation in the coil images with the point-spread function, followed by a coil combination.

The previous sections motivate that the expected aliasing artifact pattern is locally proportional to the convolution of the point-spread function of the undersampling trajectory.

The gradient at the desired, i.e. artifact free reconstructed image also follows this pattern.

Since a contribution proportional to the image itself is merely expected to alter the normalization (in particular since errors in the CSMs are spatially smooth), the contribution of the point-spread function at the origin can be taken out. For a regular parallel imaging pattern, this means that only the R−1 copies away from the origin need to be considered. For an incoherent undersampling pattern no significant peaks away from the origin are expected. Nevertheless, it makes sense to suppress the point-spread function at an origin of k-space and focus on the aliasing artifacts that appear as higher frequency ghosting.

Thus, as will be appreciated from the above, the iterative optimization to obtain the reconstructed MRI image is performed based on the MRI measurement dataset that has been acquired using an undersampling trajectory of k-space and a receiver coil array. The iterative optimization includes, for each iteration the regularization operation, see equation (3) and the data-consistency operation, see equation (2), and equation (4). The regularization operation, as a general rule, can balance a trade-off between the data consistency and the prior image. The regularization operation can be based on prior knowledge on the expected properties of the MRI images. One goal of the regularization operation is to discriminate between the actual MRI image and aliasing artifacts due to the undersampling. Thus, as a general rule, the regularization operation depends on the undersampling trajectory.

To improve the accuracy of the MRI reconstruction, it is possible to modify the regularization operation presented above in connection with equation (3). Specifically, it is possible to take into account aliasing artifacts. The regularization operation, accordingly, cannot only include the primary match, but also in aliasing data structure of the respective iteration. This aliasing data structure can be indicative of the aliasing artifacts and one or more prior images of one or more prior iterations of the iterative optimization. Such techniques are based on the finding that, since the gradient/the data-consistency operation at the desired image is still non-vanishing for the case of systematic errors in the signal model, in particular for deviating CSMs, it is helpful to learn when an update of the reconstructed image from a preceding iteration to a subsequent iteration is an artifact.

The aliasing data structure can be determined as a convolution between one or more prior images (of one or more preceding iterations of the iterative optimization) and the point-spread function (PSF) of the undersampling trajectory. As a general rule, only a single image of the preceding iteration may be used.

In detail, it could be possible to calculate the aliasing data structure either as a single image by convolution of the current image with the PSF. In that case, the peak of the PSF at the origin of k-space may be omitted or more generally suppressed. In case multiple prominent peaks away from the origin are known, aliased images may be calculated for each peak. That is, in particular, fitting for regular, parallel imaging undersampling patterns. This yields an aliased image tensor $A^{(n)}$ at the n-th iteration from $I^{(n-1)}$, for which multiple (in case of more than a single aliased image) aliased images are stacked along the channel dimension (the channel dimension describes the inputs to the deep neural network implementing the regularization operation). This aliased image tensor $A^{(n)}$ corresponds to the aliasing data structure.

It would be possible that instead of implementing the convolution only based on a single image of the most up-to-date iteration of the iterative optimization, the convolution is based on a combination of multiple prior images. The combination could be a summation or also be implemented based on a respective neural network that has been trained to emphasize aliasing artifacts.

Thus, the aliasing data structure can be determined as follows: one or more aliased images are determined, one for each of one or more peaks of the PSF. Each of the one or more aliased images is determined by a superposition of replicas of one or more prior images (e.g., a single prior image or a combination of multiple prior images, as explained above) shifted with respect to one another in accordance with the k-space position of the respective peak. Then, the one or more aliased images can be aggregated in the aliasing data structure. Such a calculation implements the convolution of the one or more prior images with the PSF in concrete terms, for the peaks of the PSF.

Thereby, the aliasing data structures are obtained and can be provided as an input to the regularization operation.

In the simplest case, the current image, current gradient and the aliased image tensor $A^{(n)}$ are concatenated along the channel dimension:

$$B^{(n)}=(I^{(n-1)},g^{(n)},A^{(n)})$$

More general, one can refer to a similar extension as on the right in Eq. (2), with $$\mathcal{B}^{(n)}=(\mathcal{J}^{(n)},\mathcal{G}^{(n)},\mathcal{A}^{(n)}) \quad (12)$$

where $\mathcal{A}^{(n)}=(A^{(1)},\ldots,I^{(n)})$ is again the concatenation of all known aliasing tensors along the channel dimension. $\mathcal{B}^{(n)}$ can be provided as an input to the neural network—e.g., U-net-implementing the regularization operation.

It is then possible to generalize Eq. (2) by extending the right tensor to $B^{(n)}$ or $\mathcal{B}^{(n)}$. However, in particular since the first layers of a U-net are convolutions anyway, one can skip Eq. (2) altogether and directly consider a more general input in the regularization network of Eq. (3) of the form $$I^{(n)}=\mathcal{U}^{(n)}(\mathcal{J}^{(n)},\mathcal{G}^{(n)},\mathcal{A}^{(n)}). \quad (13)$$

In the simplest case this could also be $$I^{(n)}=\mathcal{U}^{(n)}(I^{(n)},g^{(n)},A^{(n)}). \quad (14)$$

The gradient update is completely included in that evaluation, as is the de-aliasing.

Equation (12) is only one example of a possible input to the regularization operation. It would be possible to provide further information as the input to the regularization operation. The input to the regularization operation may, as a general rule, vary from iteration to iteration, or may be the same across all iterations.

For instance, the input of the regularization operation may include one or more of the following: a predefined reference scan image associated with the receiver coil array; an object mask associated with the receiver coil array; or a bias field associated with the receiver coil array. Such information is typically available from calibration of the receiver coil array where a reference object is measured. Such information can be helpful to derive aliasing artifacts in the images.

Yet, a further example of information to be included in the input to the regularization operation includes the CSMs. Here, it is not required that the CSMs are provided for all iterations of the iterative optimization as an input to the regularization operation. For instance, it would be possible to consider the CSMs for at least two iterations of the multiple iterations of the iterative optimization. For example, the CSMs could be included in the input to the regularization operation, e.g., towards the end of the sequence of iterations of the iterative optimization, i.e., for n→N.

Further, in a scenario in which the CSMs are included in the input for the regularization operation, they may or may not be updated. I.e., an output of the regularization operation may include an update of the CSMs. This can be, in particular, helpful towards an end of the sequence of iterations of the iterative optimization.

Such techniques are based on the finding that systematic errors in the CSMs can lead to assumption of a minimum of the optimization being reached, even though aliasing artifacts are still present. Thus, it can be helpful to allow for adaptation of the CSMs towards the end of the iterative optimization, so as to avoid systematic errors that could yield an erroneous minimum.

FIG. 1 depicts aspects with respect to an MRI device 100. The MRI device 100 includes a magnet 110 which defines a bore 111. The magnet 110 may provide a DC magnetic field of one to six Tesla along its longitudinal axis. The DC magnetic field may align the magnetization of the patient 101 along the longitudinal axis. The patient 101 may be moved into the bore by a movable table 102.

The MRI device 100 also includes a gradient system 140 for creating spatially-varying magnetic gradient fields (gradients) used for spatially encoding MRI data. Typically, the gradient system 140 includes at least three gradient coils 141 that are arranged orthogonal to each other and may be controlled individually. By applying gradient pulses to the gradient coils 141, it is possible to apply gradients along certain directions. The gradients may be used for slice selection (slice-selection gradients), frequency encoding (readout gradients), and phase encoding along one or more phase-encoding directions (phase-encoding gradients). Hereinafter, the slice-selection direction will be defined as being aligned along the Z-axis; the readout direction will be defined as being aligned with the X-axis; and a first phase-encoding direction as being aligned with the Y-axis. A second phase-encoding direction may be aligned with the Z-axis. The directions along which the various gradients are applied are not necessarily in parallel with the axes defined by the coils 141. Rather, it is possible that these directions are defined by a certain k-space trajectory, which, in turn, may be defined by certain requirements of the respective MRI sequence and/or based on anatomic properties of the patient 101.

For preparation and/or excitation of the magnetization polarized/aligned with the DC magnetic field, RF pulses may be applied. For this, an RF coil assembly 121 is provided which is capable of applying an RF pulse such as an inversion pulse or an excitation pulse. While the inversion pulse generally inverts the direction of the longitudinal magnetization, excitation pulses may create transversal magnetization.

For creating such RF pulses, a RF transmitter 131 is connected via a RF switch 130 with the coil assembly 121. Via a RF receiver 132, it is possible to detect signals of the magnetization relaxing back into the relaxation position aligned with the DC magnetic field. In particular, it is possible to detect echoes; echoes may be formed by applying one or more RF pulses (spin echo) and/or by applying one or more gradients (gradient echo). The magnetization may inductively coupled with the coil assembly 121 for this purpose. Thereby, raw MRI data in k-space is acquired; according to various examples, the associated MRI measurement datasets including the MRI data may be post-processed in order to obtain images. Such post-processing may include a Fourier Transform from k-space to image space. Such post-processing may also include MRI image reconstruction to avoid aliasing where an undersampling scheme is used.

Generally, it would be possible to use separate coil assemblies for applying RF pulses on the one hand side and for acquiring MRI data on the other hand side (not shown in FIG. 1). For example, for applying RF pulses a comparably large body coil 121 may be used; while for acquiring MRI data a surface coil assembly including an array of comparably small coils could be used. For example, the surface coil assembly could include 32 individual RF coils arranged as receiver coil array 139 and thereby facilitate spatially-offset coil sensitivities. Respective CMSs are defined.

The MRI device 100 further includes a human machine interface 150, e.g., a screen, a keyboard, a mouse, etc. By the human machine interface 150, a user input may be detected and output to the user may be implemented. For example, by the human machine interface 150, it is possible to set certain configuration parameters for the MRI sequences to be applied.

The MRI device 100 further includes a processing unit (simply processor) 161. The processor 161 may include a GPU and/or a CPU. The processor 161 may implement various control functionality with respect to the operation of the MRI device 100, e.g., based on program code loaded from a memory 162. For example, the processor 161 could implement a sequence control for time-synchronized operation of the gradient system 140, the RF transmitter 131, and the RF receiver 132. The processor 161 may also be configured to implement a reconstruction procedure, i.e., implement post-processing for MRI image reconstruction of MRI images based on MRI measurement datasets.

It is not required in all scenarios that processor 161 implements post-processing for reconstruction of the MRI images. In other examples, it would be possible that respective functionalities implemented by a separate device, such as the one as illustrated in FIG. 2.

Figure 2:
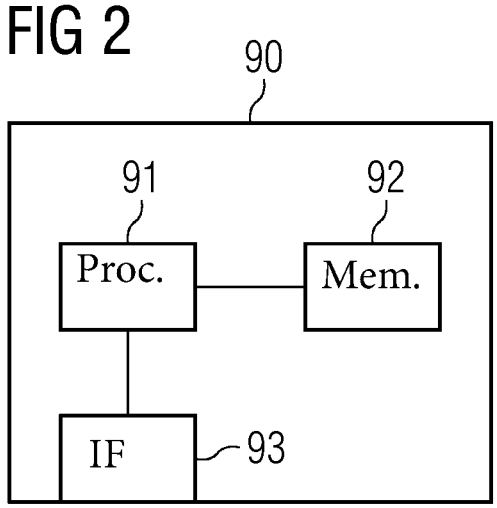
FIG. 2 schematically illustrates a device for MRI image reconstruction according to various examples.

FIG. 2 schematically illustrates a device 90 according to various examples. The device 90 includes a processing unit/processor 91 and a memory 92. The processor 91 can obtain an MRI measurement dataset via an interface 93, e.g., from a hospital database, a computer-readable storage medium, or directly from an MRI device 100 as discussed in connection with FIG. 1. Upon loading program code from the memory 92, the processor 91 can post-process the MRI measurement dataset, to reconstruct an MRI image. Details with respect to such processing are illustrated in connection with FIG. 3.

Figure 3:
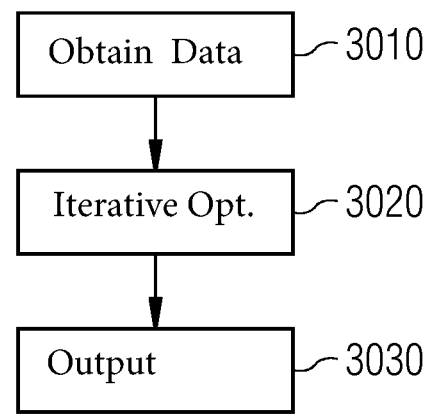
FIG. 3 is a flowchart of a method according to various examples.

FIG. 3 is a flowchart of a method according to various examples. For illustration, the method of FIG. 3 could be executed by the processor 161 of the MRI device 100, upon loading program code from the memory 162. It would be possible that the method of FIG. 3 is executed by the processor 91 of the device 90, upon loading program code from the memory 92.

At box 3010, an MRI measurement dataset is obtained. The MRI measurement dataset has been acquired using an undersampling trajectory of k-space and a receiver coil array (cf. FIG. 1, MRI device 100, receiver coil array 139).

Next, at box 3020, an iterative optimization is performed to obtain a reconstructed MRI image. This corresponds to MRI reconstruction.

At box 3030, the reconstructed MRI images output, e.g., to the user via a user interface. The reconstructed MRI image could also be stored.

Details with respect to the iterative optimization of box 3020 are described below in connection with FIG. 4.

Figure 4:
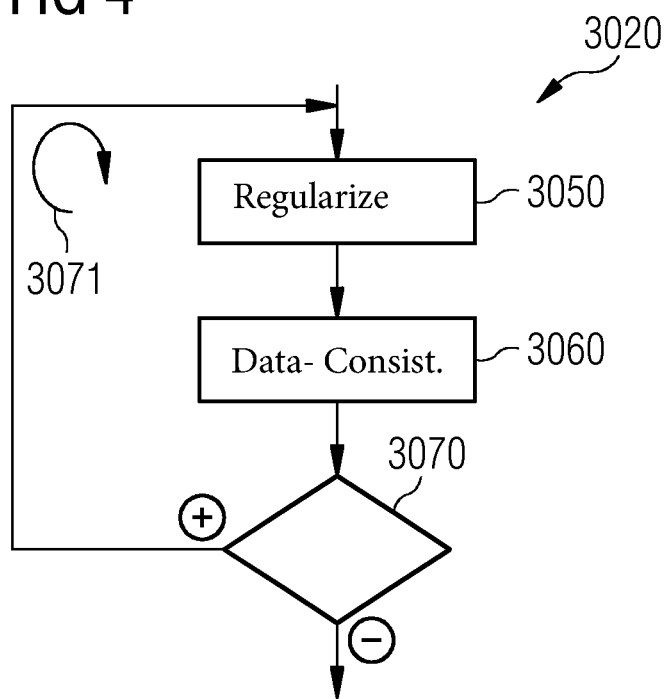
FIG. 4 is a flowchart of a method according to various examples.

FIG. 4 illustrates multiple iterations 3071. Each iteration 3071 includes a regularization operation, box 3050; and a data-consistency operation at box 3060.

A concrete implementation of box 3050 and box 3060 could be based on Knoll, Florian, et al. "Deep learning methods for parallel magnetic resonance image reconstruction." arXiv preprint arXiv:1904.01112 (2019): equation 12. Here, the left term included in the bracket corresponds to the regularization operation and the right term included in the bracket corresponds to the data-consistency operation. Note that in this publication the regularization operation does not rely on an input that would include the aliasing data structure. According to various examples described herein, the input of the regularization operation includes the prior image and an aliasing data structure of the respective iteration. The aliasing data structures indicative of aliasing artifacts and one or more prior images of one or more proceeding iterations 3071.

Then, at box 3070, it is checked whether a further iteration is required; and, in the affirmative, box 3050 and box 3060 are re-executed.

It would be possible that at box 3070 it is checked whether a certain predefined count of iterations has been reached. This can be an abort criterion. Other abort criteria are conceivable, e.g., as defined by the optimization method (convergence into a minimum), e.g., gradient descent.

According to various examples described herein, it would be possible that the input to the regularization operation at box 3050 depends on the particular iteration 3071. For instance, one or more later iterations 3071 towards the end of the iterative optimization may be implemented such that the input to the regularization operation also includes the CSMs. An output of the regularization operation can also include an update of the CSMs. This means that the CSMs—that have been predefined, e.g., based on calibration measurements or depending on the coil geometry—are updated as part of the iterative optimization. Thereby, systematic errors can be reduced that would otherwise be present in view of systematic inaccuracies in the definition of the CSMs. As a general rule, it would be possible that all or some of the iterations 3071 consider the CSMs as an input to the regularization operation; but that only a subfraction of these iterations 3071 provide an update to the CSMs.

Figure 5:
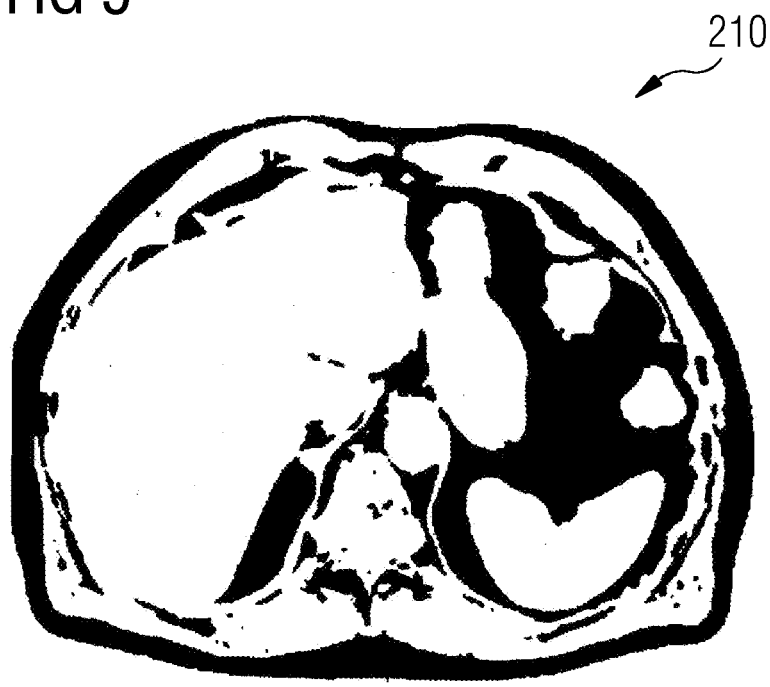
FIG. 5 schematically illustrates an MRI image according to one example.

FIG. 5 schematically illustrates aspects with respect to an MRI image 210. FIG. 5 schematically illustrates the MRI image 210. For instance, the MRI image 210 may be obtained in a certain iteration 3071. Then, it is possible to calculate an aliasing data structure based on the prior image 210. This is illustrated in connection with FIG. 6.

Figure 6:
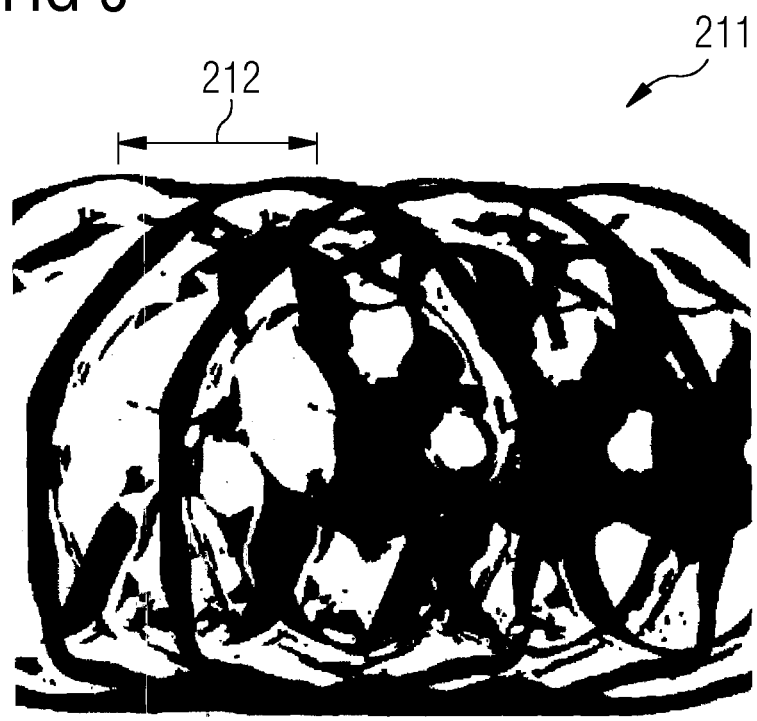
FIG. 6 schematically illustrates an example aliasing image determined based on the MRI image of FIG. 5.

FIG. 6 schematically illustrates an aliased image 211 as determined based on the MRI image 210 of FIG. 5. The aliasing data structure—cf. Eq. (12)—includes one or more such aliased images 211.

The aliased image 211 is determined as follows: a peak of the PSF is determined and then a superposition of replicas of the MRI image 210 are shifted with respect to each other in accordance with the k-space position of the respective peak of the PSF. The corresponding spatial shift 212 is illustrated in FIG. 6.

Figure 7:
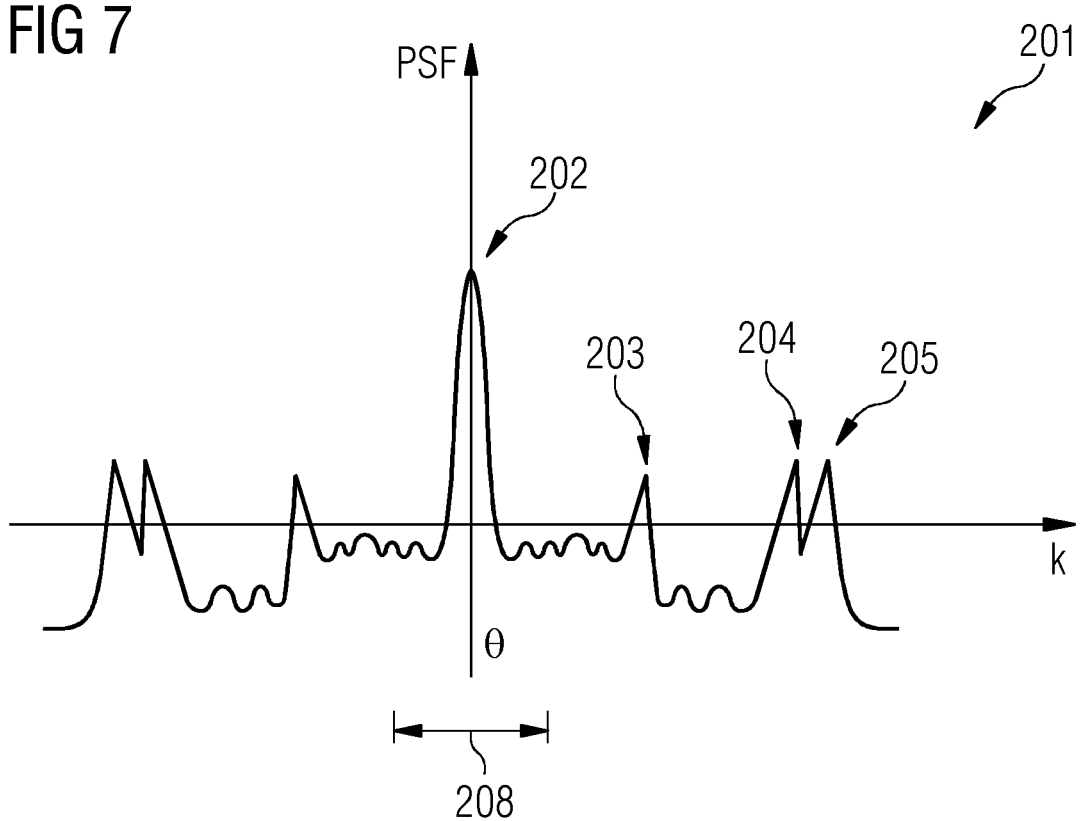
FIG. 7 schematically illustrates a point-spread function of a k-space trajectory undersampling the k-space according to an example.

Multiple aliasing images—together forming the aliased data structure—can be determined for multiple peaks of the PSF (not illustrated in FIG. 6). An example, PSF 201 as illustrated in FIG. 7. The PSF 201 includes multiple peaks 202-205. The peak 202, i.e., the contribution of the PSF 201 at the origin 208 of k-space—can be suppressed; i.e., there may be no contribution to the aliasing data structure based on this peak 202.

The remaining peaks 203-205 may be used to determine respective aliased images 211. The aliasing data structure can then include multiple aliased images 211 concatenated to each other, i.e., associated with different channels of the input to the deep neural network. Accordingly, the aliasing data structure is determined based on a convolution between the prior image 210 and the PSF 201 of the undersampling trajectory.

Instead of using a single prior image 210 for determining the aliasing data structure, it would be possible to consider multiple prior images, e.g., determine a combination of the multiple prior images and then determine the respective aliased images based on the respective peaks 203-205 of the PSF 202 and the respective aliased images that is obtained from the combinations this superposition of the multiple prior images.

Figure 8:
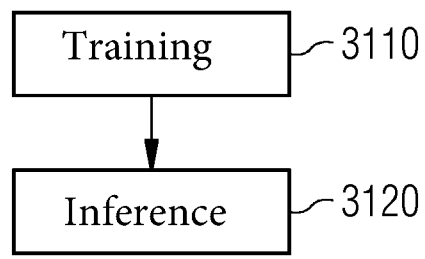
FIG. 8 is a flowchart of a method according to various examples.

FIG. 8 is a flowchart of a method according to various examples. FIG. 8 illustrates that at box 3120 inference is implemented, i.e., MRI images are reconstructed from MRI measurement datasets without a ground truth of the reconstructed MRI images being available. This is based on techniques as described above, e.g., in connection with FIG. 3. The MRI image reconstruction relies on a convolutional deep neural network. Machine learning can be implemented to train the convolutional deep neural network. This machine learning takes place in the training phase at box 3110. Weights of an unrolled network can be trained.

The training at the training phase at box 3110 can include a further iterative optimization, i.e., different to the iterative optimization described in connection with FIG. 4. The purpose of the iterative optimization of box 3110 is determining weights of the convolutional neural network. For this, a loss function can be considered for each iteration. The loss function is based on a difference between an output of the convolutional neural network at that iteration and a MRI image that has been predefined as ground truth. This means that the loss function can take smaller values if the difference is smaller; then, the convolutional network approximates the synthesized MRI image accurately, e.g., without aliasing artifacts. Depending on the value of the loss function, it is then possible to adjust weights of the convolutional neural network. This can be based on techniques such as back propagation.

This convolutional network that has been appropriately trained can then be used to implement the regularization operation at box 3050 of FIG. 4.

According to various examples, it is possible that the loss function considered during the training phase at box 3110 includes an aliasing term penalizing aliasing artifacts in the output of the convolutional neural network. This means that the weights of the convolutional neural network set during the training phase at box 3110 tend to suppress aliasing artifacts. This helps for a more accurate MRI image reconstruction.

Such techniques of tailoring the convolutional neural network to suppress aliasing artifacts can be combined with techniques described above in which the aliasing data structure is used as an input to the convolutional neural network. In other examples, it would be possible to use one of those two techniques in isolation.

As a general rule, various options are conceivable to determine whether the output of the convolutional neural network has contributions from aliasing artifacts. For example, in a supervised learning scenario, an operator may judge whether aliasing artifacts are visible. It would also be possible to calculate whether the output of the convolutional neural network has contributions from aliasing artifacts. This is described below in further detail.

When retrospectively performing undersampling to generate input data for training and taking the MRI image acquired with lower acceleration as ground truth, aliasing becomes evident in conventionally reconstructed images. The expected aliasing pattern can be obtained from conventional reconstructions and is dominant in the subtraction of the considered ground truth and the conventionally reconstructed image with undersampling. In detail: The MRI image predefined as ground truth can be obtained as follows: the k-space can be sampled at a given acceleration factor, wherein the acceleration factor can also be 1 (i.e., the k-space is fully sampled). Then, it would be possible to retrospectively perform undersampling, i.e., remove data samples in accordance with a hypothetical k-space trajectory implementing a higher acceleration factor, e.g., R=2 or R=3. This yields a synthetic undersampled MRI dataset. Then, a conventional MRI image reconstruction, e.g., compressed sensing such as SENSE-type, could be implemented based on the synthetic undersampled MRI dataset. Then, a difference between the originally acquired MRI image based on the low acceleration factor with the MRI image obtained from MRI image reconstruction based on the synthetic undersampled MRI dataset highlights the aliasing artifacts. It would be possible to search for such patterns in the output of the convolutional neural network to determine a value of the aliasing term analyzing the aliasing artifacts.

A pixel-wise weighting of a comparison between the output of the convolutional neural network and the MRI image, as considered by the loss function, may be applied. Here, the pixel-wise weighting can depend on the aliasing artifacts, e.g., as determined above. This pattern of the pixel-wise weighting can be emphasized e.g. by smoothing the magnitude of the difference image. This—potentially smoothed difference—results in a spatially varying weight image $\omega(x)$ implementing the aliasing term, where x refers to the pixel position.

For the training of the reconstruction network the loss function can be a sum of pixel-wise functions in network predictions and ground truth, i.e.

$$\text{loss} = \Sigma_x f(\text{network}(x), \text{groundtruth}(x)). \quad (15)$$

This is only one option for implementing the aliasing term penalizing aliasing artifacts in the loss function when performing training. Another example could rely determining an edge-filtered representation of the output of the convolutional neural network and then perform a cross-correlation of that edge-filtered representation. If the cross-correlation includes significant peaks, this can be indicative of aliasing artifacts and it would be possible to accordingly penalize the output, e.g., proportional to the height of the peaks or otherwise.

In yet another scenario, it would be possible that the aliasing term in the loss function includes a further neural network that has been specifically trained to detect aliasing artifacts. For instance, the further neural network could be a further convolutional neural network. It would be possible that such further convolutional neural network is trained using a generative adversarial network architecture including the further convolutional neural network as a discriminator. Then, semi-supervised training of the further convolutional neural network as possible. In detail, in such an approach it is possible to label many MRI images as having aliasing artifacts and then use them as training dataset to train the generator of the generative adversarial network in order to suppress aliasing artifacts. As a side result, this approach can also deliver a loss function that is sensitive to aliasing.

Although the invention has been shown and described with respect to certain preferred embodiments, equivalents and modifications will occur to others skilled in the art upon the reading and understanding of the specification. The present invention includes all such equivalents and modifications and is limited only by the scope of the appended claims.

The invention claimed is:

1. A computer-implemented method for reconstructing a Magnetic Resonance Imaging (MRI) image, the method comprising:
   obtaining an MRI measurement dataset being acquired using an undersampling trajectory of k-space and a receiver coil array, and
   based on the MRI measurement dataset, performing an iterative optimization to obtain a reconstructed MRI image,
   wherein the iterative optimization comprises, for each iteration of multiple iterations of the iterative optimization, a regularization operation and a data-consistency operation to obtain a respective current image,
   wherein the data-consistency operation is based on a difference between the MRI measurement dataset and a synthesized MRI measurement dataset, which is based on a k-space representation of a prior image of the multiple iterations, the undersampling trajectory, and a sensitivity map associated with the receiver coil array,
   wherein an input of the regularization operation comprises the prior image and an aliasing data structure of the respective iteration, the aliasing data structure being indicative of aliasing artifacts in one or more prior images of one or more preceding iterations.

2. The computer-implemented method of claim 1, wherein the aliasing data structure is determined based on a convolution between the one or more prior images and a point-spread function of the undersampling trajectory.

3. The computer-implemented method of claim 2, wherein a contribution of the point-spread function at the origin of k-space is suppressed when determining the aliasing data structure.

4. The computer-implemented method of claim 2, wherein the convolution is between a combination of multiple prior images and the point-spread function of the undersampling trajectory.

5. The computer-implemented method of claim 2, further comprising:
   determining one or more aliased images for one or more peaks of the point-spread function by a superposition of replicas of the one or more prior images shifted with respect to each other in accordance with a k-space position of the respective one of the one or more peaks, and
   aggregating the one or more aliased images in the aliasing data structure.

6. The computer-implemented method of claim 1, wherein the input of the regularization operation comprises one or more of the following: a predefined reference scan image associated with the receiver coil array; an object mask associated with the receiver coil array; or a bias field associated with the receiver coil array.

7. The computer-implemented method of claim 1,
wherein the input of the regularization operation of the iterative optimization comprises, for at least two iterations of the multiple iterations, the sensitivity map.

8. The computer-implemented method of claim 7,
wherein an output of the regularization operation comprises, for the at least two iterations of the multiple iterations, an update of the sensitivity map.

9. The computer-implemented method of claim 7,
wherein the at least two iterations are arranged towards an end of a sequence of the multiple iterations.

10. The computer-implemented method of claim 1,
wherein the iterative optimization minimizes a goal function comprising a data-integrity operation and the regularization operation based on one or more of the following: gradient descent, Landweber iterations, primaldual methods, or the alternating direction method of multipliers algorithm.

11. The computer-implemented method of claim 1,
wherein the regularization operation is implemented by a convolutional neural network comprising multiple layers and inter-layer skip connections,
wherein different layers of the multiple layers of the convolutional neural network are associated with different iterations of the iterative optimization.

12. A device comprising:
control circuitry for reconstructing a Magnetic Resonance Imaging (MRI) image, the control circuitry being configured to:
 obtain an MRI measurement dataset being acquired using an undersampling trajectory of k-space and a receiver coil array, and
 based on the MRI measurement dataset, perform an iterative optimization to obtain a reconstructed MRI image,
wherein the iterative optimization comprises, for each iteration of multiple iterations of the iterative optimization, a regularization operation and a data-consistency operation to obtain a respective current image,
wherein the data-consistency operation is based on a difference between the MRI measurement dataset and a synthesized MRI measurement dataset which is based on a k-space representation of a prior image of the multiple iterations, the undersampling trajectory, and a sensitivity map associated with the receiver coil array,
wherein an input of the regularization operation comprises the prior image and an aliasing data structure of the respective iteration, the aliasing data structure being indicative of aliasing artifacts in one or more prior images of one or more preceding iterations.

13. The device of claim 12, wherein the control circuitry is configured so that the aliasing data structure is determined based on a convolution between the one or more prior images and a point-spread function of the undersampling trajectory.

* * * * *